United States Patent [19]

Shirai et al.

[11] 4,271,582
[45] Jun. 9, 1981

[54] PROCESS FOR PRODUCING A SEMICONDUCTOR DEVICE

[75] Inventors: Kazunari Shirai; Izumi Tanaka; Shinpei Tanaka; Keiji Nishimoto, all of Yokohama, Japan

[73] Assignee: Fujitsu Limited, Kanagawa, Japan

[21] Appl. No.: 70,610

[22] Filed: Aug. 29, 1979

[30] Foreign Application Priority Data

Aug. 31, 1978 [JP] Japan .................... 53-106761

[51] Int. Cl.$^3$ ............................. H01L 21/22
[52] U.S. Cl. ............................. 29/571; 29/576 T; 148/1.5; 148/187; 357/52
[58] Field of Search ........... 29/571, 576 T; 148/1.5, 148/187; 357/52

[56] References Cited

U.S. PATENT DOCUMENTS

| | | | |
|---|---|---|---|
| 3,349,474 | 10/1967 | Rauscher ........................ 148/1.5 X |
| 3,615,942 | 10/1971 | Blumenfeld et al. ............ 148/187 |
| 3,825,442 | 7/1974 | Moore ........................... 148/1.5 X |
| 3,887,407 | 6/1975 | Ono et al. ..................... 29/571 X |
| 3,909,320 | 9/1975 | Cauge et al. .................. 148/187 |
| 3,923,559 | 12/1975 | Sinha ........................... 148/1.5 |
| 3,972,756 | 8/1976 | Nagase et al. ................ 29/571 X |
| 3,986,903 | 10/1976 | Watrous ....................... 148/187 |
| 4,009,058 | 2/1977 | Mills .......................... 148/187 X |
| 4,028,150 | 6/1977 | Collins ........................ 148/187 |
| 4,079,504 | 3/1978 | Kosa ........................... 148/187 X |
| 4,151,007 | 4/1979 | Levenstein et al. ........... 357/52 |
| 4,224,089 | 9/1980 | Nishimoto et al. ............ 148/187 |

Primary Examiner—G. Ozaki
Attorney, Agent, or Firm—Staas & Halsey

[57] ABSTRACT

In a method of smoothing the edges of a window through a PSG film of a semiconductor device, a masking film is provided under the PSG film, so as to prevent impurities of the PSG film from penetrating into semiconductor substrate during the heating of the PSG film for the smoothing of the edges. A masking film, for example, an $Si_3N_4$ film, does not, however, inhibit the penetration of hydrogen gas, which can improve the properties of an MIS semiconductor device.

12 Claims, 12 Drawing Figures

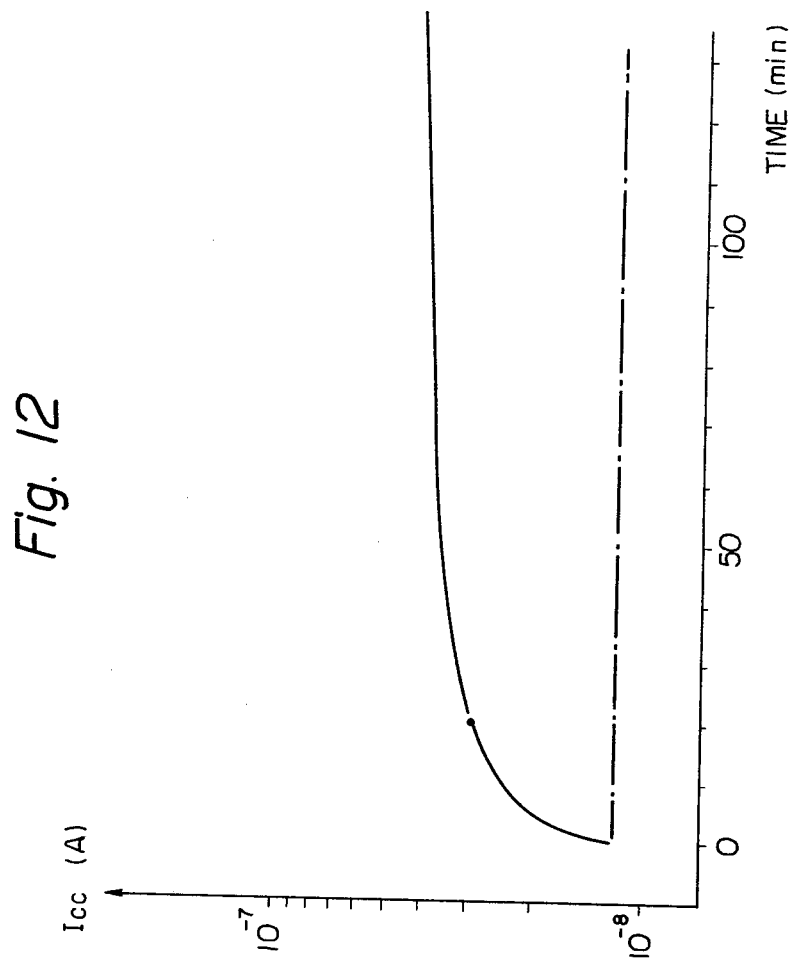

PROCESS FOR PRODUCING A SEMICONDUCTOR DEVICE

BACKGROUND OF THE INVENTION

1. Field of the Invention

The present invention relates to a process for producing a semiconductor device, and particularly an improvement of a process in which the edges of a window through a glass film of the semiconductor device are smoothed or rounded so as to prevent the disconnection of wiring of the semiconductor device at such edges.

2. Description of the Prior Art

It has been proposed by Intel Corporation, in Japanese published patent application No. 50-6143, that the edges of a glass layer formed on an insulating layer, which covers a semiconductor substrate, be smoothed or rounded by the following procedure. After exposing pertinent portions of the semiconductor substrate, the glass film is heated so that the edges of a window are formed smoothly by a plastic flow, and electrical contact with the exposed part of the semiconductor substrate is provided through the smoothed window. It is possible by means of this proposed process to smooth or round the edges formed at the shoulder part of a window through a glass layer, for example, the phosphosilicate glass (PSG) layer of an N channel MIS type semiconductor device, in which the N type source and drain regions are formed on the P type semiconductor substrate. In the production of such an N channel MIS type semiconductor device, when a layer of an electrode metal, for example aluminum, is to be located on the source and drain regions, the phosphosilicate glass (PSG) is thermally melted so as to smooth the edges of the window, thereby preventing the disconnection of the electrode at the edges. However, when the melting treatment as proposed in the Japanese published patent application No. 50-6143 is applied to the P channel MIS type semiconductor device, the phosphorus is deposited from the PSG layer during the melting thereof and forms a phosphorus diffusion layer on the surface of the P type source and drain regions, which can result in poor contact or contact resistance between the electrode metal and these regions. Furthermore, in the production of the N channel MIS type semiconductor device, the phosphorus is disadvantageously diffused from the PSG layer into the N type source and drain regions in which, prior to the heating of the PSG layer, the impurities already deposited determines the junction depth and resistance of the source and drain regions.

It is an object of the present invention to provide a simple process for achieving the prevention of an inferior connection of electrodes with a substrate at an electrode window and to prevent the diffusion of impurities from a glass layer to a semiconductor substrate.

It is another object of the present invention to provide a simple process for preventing inadequate contact between a metal layer of electrodes and the source and drain regions of a P channel MIS type semiconductor device.

It is a further object of the present invention to provide a process in which hydrogen can be used in the improvement and stabilization of interface conditions between a semiconductor substrate and a gate insulating film, in combination with the measures for preventing inadequate contact between a metal layer of electrodes and the source and drain regions of a P channel MIS type semiconductor device.

In accordance with the present invention, there is provided a process for producing a semiconductor device comprising, a semiconductor substrate, on which a source region and a drain region are formed with a gate region positioned between the source and drain regions, a gate insulating film formed on the gate region, and, a gate electrode formed on the gate insulating film, said process comprising the steps of:

forming the gate insulating film;

forming the gate electrode on the gate insulating film;

forming the source and drain regions in such a manner that the gate electrode is positioned between these regions;

forming a masking film over the source and drain regions and gate electrode;

forming a glass layer over the masking film;

opening precursory electrode windows through predetermined portions of the glass layer;

subjecting the glass layer to a heat treatment;

opening an aperture at the precursory windows through said masking film, thereby completing electrode windows;

depositing an electrode material on the so completed electrode windows, which electrode material extends from the windows; and subjecting the semiconductor substrate to a heat treatment under a hydrogen atmosphere subsequently to the heat treatment step of the glass layer and prior to the step of depositing the electrode material.

In accordance with the present invention, there is also provided a process for producing a semiconductor device, such as an MOS capacitor, comprising, a semiconductor substrate, an insulating film formed on one region of the semiconductor substrate, and an electrode formed on the insulating film, said process comprising the steps of:

forming the insulating film;

forming the electrode on the insulating film;

forming a masking film over the electrode;

forming a glass layer over the masking film;

opening a precursory electrode window through a predetermined portion of the glass layer;

subjecting the glass layer to a heat treatment;

opening an aperture at the precursory window through the masking film, thereby completing an electrode window;

depositing an electrode material on the so completed window, thereby placing on the window an electrode, which electrode extends therefrom; and subjecting the semiconductor substrate to a heat treatment under a hydrogen atmosphere subsequent to the heat treatment step of the glass layer and prior to the depositing step of the electrode material.

One of the important points of the present invention resides in the fact that the masking film, which inhibits impurity penetration, is formed over at least the electrode covering an insulating layer and occasionally over the source, drain and gate regions, prior to the formation of the glass layer, and further, that the semiconductor substrate is subjected to a heat treatment under a hydrogen atmosphere subsequent to the heating step of the glass layer and prior to the depositing step of the electrode material.

In the process of the present invention, the masking film inhibits diffusion of impurities of the glass layer, such as arsenic silicate glass, borosilicate glass and especially phosphosilicate glass (PSG), into the semiconductor substrate. The penetration of phosphorus from the PSG into the P type regions of the semiconductor substrate can advantageously be inhibited by the masking film. The masking film may be one layer of silicon nitride film, but preferably should be two layers consisting of a lower silicon dioxide film and an upper silicon nitride film. One of the functions of the lower silicon dioxide film is to protect the semiconductor substrate from etching during the etching of the upper silicon nitride film. When the silicon nitride film is subjected to a plasma etching by means of, for example, carbon tetrafluoride gas, if the silicon dioxide film has a thickness ranging from 200 to 300 A, it can effectively interrupt the effects of the Freon gas. Another function of the lower silicon dioxide film is to inhibit the penetration of the precipitated phosphorus in the PSG film into the semiconductor substrate. The silicon dioxide film may be produced by a known thermal oxidation method of the silicon substrate and has a thickness preferably in the range of from 200 to 300 A. The silicon nitride film may be produced by a known chemical vapour deposition method using ammonia and monosilane, and has a thickness preferably in the range of from 400 to 500 A.

Another important point of the present invention is that the silicon nitride film, on which the glass layer is deposited, is not removed selectively. It is, therefore, possible to produce an MIS type semiconductor device by a simple process without an inconvenient step of selective removal of the silicon nitride film. The heat treatment under the hydrogen atmosphere according to the present invention can be carried out equally effectively at any point in the production of a semiconductor, i.e. after the melting of the glass layer and before the depositing of the electrode material. When the heat treatment under the hydrogen atmosphere is carried out at an elevated temperature of 800° C. or higher, in addition to a known heat treatment under a hydrogen atmosphere at a low temperature of from 400° to 500° C., the surface state of the semiconductor substrate, especially the interface state between the semiconductor substrate and gate oxide film, is considerably improved over the known heat treatment under hydrogen. The heating time at the high and low temperatures mentioned above ranges from 20 to 60 minutes. According to the process of the present invention, secular changes of properties of the semiconductor device can be reduced to a level lower than that obtained by the conventional process.

BRIEF DESCRIPTION OF THE DRAWINGS

A preferred embodiment of the present invention will hereinafter be explained in comparison with the process proposed in the prior United States application Ser. No. 971,692, filed Dec. 21, 1978 by Fujitsu Limited, now U.S. Pat. No. 4,224,089 and with reference to the drawings, wherein:

FIG. 12 is a graph indicating secular changes of source current.

DESCRIPTION OF PREFERRED EMBODIMENTS

Figure 1:
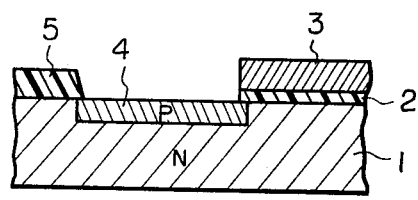
FIGS. 1 through 6 are partial cross-sectional views of a semiconductor device being produced by the process of the prior U.S. application mentioned above.
Figure 2:
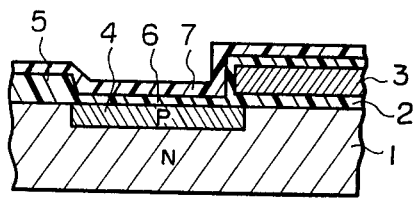
Figure 3:
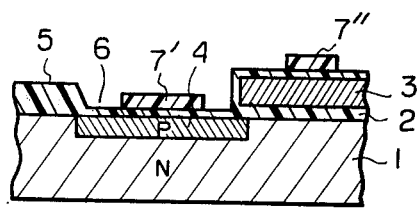
Figure 4:
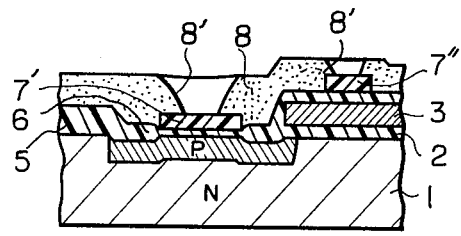

In FIG. 1, a gate electrode and one of the source and drain regions adjoining the gate electrode are illustrated. A gate oxide film 2 is selectively formed on an N type silicon semiconductor substrate 1. A gate electrode 3, consisting of polycrystalline silicon, is located on the gate oxide film 2. Impurities, which provide the N type silicon semiconductor substrate 1 with a P type conductivity, are introduced into the substrate 1 using the gate electrode 3 as a mask, and the source and drain regions, one of which is denoted as 4 in FIG. 1, are formed. Reference numeral 5 indicates a field oxide film. Subsequently, as shown in FIG. 2, a silicon dioxide ($SiO_2$) film 6 and a silicon nitride ($Si_3N_4$) film 7 are deposited on the entire surface of the semiconductor device being produced. The silicon nitride film 7 is then selectively removed to form patterns thereof 7' and 7" (FIG. 3) covering the portions of the silicon dioxide film 6 through which an electrode window is to be formed. The pattern 7' of the silicon nitride film determines the position of the electrode window for the source or drain electrode, while the pattern 7" of the silicon nitride film determines the position of the electrode window for the gate electrode 3. The gate electrode window is only formed if necessary. Subsequently, as shown in FIG. 4, the regions of the silicon substrate 1 and the gate electrode 3 which are not located below the patterns 7' and 7" of the silicon nitride, are oxidized. Accordingly, phosphorus is not diffused under these oxidized regions from a phosphosilicate glass (PSG) layer 8 into the P type source or drain region 4 at a time of melting the PSG layer 8. After the oxidation, the PSG layer 8 is deposited over the entire surface of the semiconductor device being produced, and then, precursory electrode windows 8' for an electrode contact are opened through the PSG layer 8. Thereafter, the PSG layer 8 is melted, whereby the edges of the precursory electrode windows become a gradual slope as shown in FIG. 4.

Figure 5:
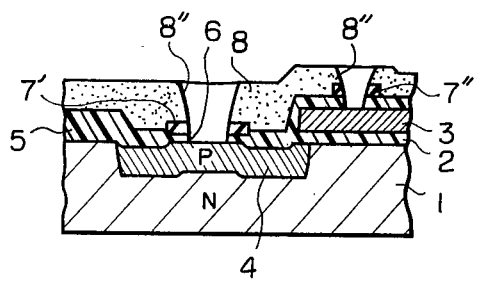
Figure 6:
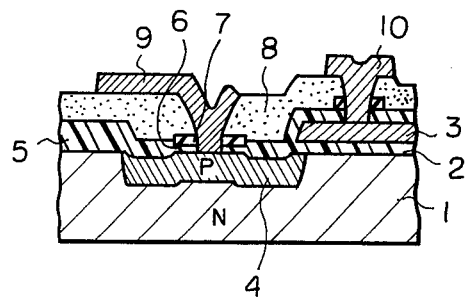

Referring to FIG. 4, the patterns 7' and 7" of the silicon nitride film 7, exposed through the precursory electrode windows 8' and the silicon dioxide film 6 are removed by etching using the PSG layer 8 as a mask, thereby completing electrode windows 8" (FIG. 5). An aluminum (A1) layer is then deposited over the entire surface of the semiconductor substrate being produced. As seen in FIG. 6, an electrode 9 of the source or drain and an electrode 10 of the gate electrode are formed by a selective etching of the aluminum layer.

Referring to the FIGS. 7 through 11, a process for producing a semiconductor device, for example, a P channel metal insulator semiconductor (MIS) device according to an embodiment of the present invention, is explained.

Figure 7:
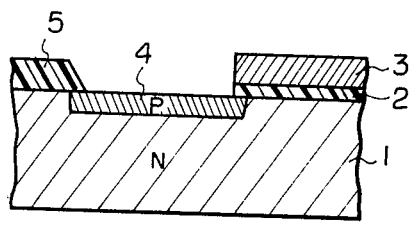
FIGS. 7 through 11 are partial cross-sectional views of a semiconductor device in stages of production in accordance with the present invention.
Figure 8:
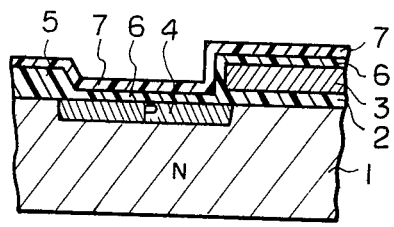
Figure 9:
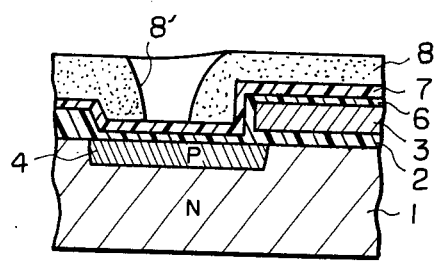

Referring to FIG. 7, which is similar to FIG. 1, a well known process for producing a silicon gate MIS FET which is applied in the production of the MIS device will now be described. A gate oxide film 2 having a thickness of from 500 to 1000 A is selectively formed on an N type silicon semiconductor substrate 1. A gate electrode 3, consisting of polycrystalline silicon and having a thickness of from 3000 to 5000 A, is formed on the gate oxide film 2. Impurities, which provide the N type silicon semiconductor substrate 1 with a P type conductivity, are introduced into the substrate 1 in a concentration of from $10^{19}$ to $10^{21}/cm^3$, using the gate electrode 3 as a mask, and the source and drain regions, one of which is denoted as 4 in FIG. 7, are formed. Reference numeral 5 indicates a field oxide film. As shown in FIG. 8, a silicon dioxide ($SiO_2$) film 6 having a thickness of from 200 to 300 A is formed by a thermal oxidation, and a silicon nitride ($Si_3N_4$) film 7 having a thickness of from 400 to 500 A is deposited by a conventional vapor phase growth deposition on the entire surface of the semiconductor device being produced. It should be noted that it is also possible to utilize a sputtering method instead of the vapor phase growth deposition method.

As a protecting glass film containing an impurity, a phosphosilicate glass (PSG) film 8 (FIG. 9), of a thickness of from 5000 to 15,000 A, preferably about 10,000 A, is formed. The region of the PSG film which is to contain an electrode window is then etched by the photolithographic method, using a solution of ammonium fluoride and hydrogen fluoride ($NH_4F+HF$) as the etching agent, to open a precursory electrode window 8' for an electrode contact therein.

In addition to the phosphosilcate glass, arsenosilicate glass (AsSG), borosilicate glass (BSG) or phosphosilicate glass containing germanium (GePSG), may be used for the protecting glass, however, they are not as preferable as phosphosilicate glass (PSG), because of such properties as the melting points and electrical properties of these glass materials.

The phosphosilcate glass film 8 is softened by heating at a temperature of from 1050° to 1100° C., whereby the surface thereof becomes smooth and, especially, the edge portion of the phosphosilicate glass film 8 defining the precursory electrode window 8' is provided with a gradual slope. During the heating treatment the phosphorus is diffused out of the phosphosilicate glass (PSG) film 8. However, the films 6 and 7 stop the out-diffused phosphorus from entering into the P type region 4.

Subsequently, a heat treatment of the semiconductor substrate is carried out under a hydrogen atmosphere, at a temperature of from 800° to 900° C. or to as high as 1050° C., over a period of approximately 20 minutes. Since the heating temperature under the hydrogen atmosphere is adjusted so that it is higher than the conventional temperature of approximately 450° C., for example, to a temperature of from 800° to 1050° C., the penetration of hydrogen is not essentially inhibited by the silicon nitride film.

Figure 10:
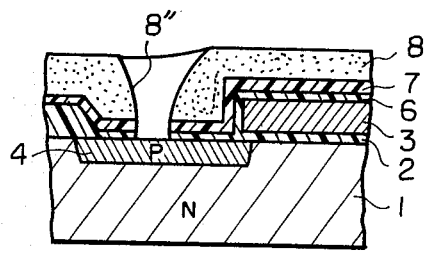

Referring to FIG. 10, the PSG layer 8 is used as a mask for removing the silicon nitride film 7 and the silicon dioxide film 6 which are within the precursory electrode window 8'.

The silicon nitride film 7 may be etched using carbon tetrafluoride gas as an etching agent by a plasma etching method. In this case, the etching rate of the silicon nitride film 7 is approximately 100 times higher than the etching rate of the phosphosilicate glass (PSG) layer 8. Accordingly, it is possible to remove the silicon nitride film 7 while only a slight part of the phosphosilicate glass (PSG) film 8 is etched. Then, the silicon dioxide film 6 is etched by applying a chemical etching method using a solution of ammonium fluoride and hydrogen fluoride ($NH_4F+HF$). With such etching, when a silicon dioxide film 6 of 200 A thickness is etched, the window is widened by approximately 2500 A. Such enlargement of the width of the window can be ignored, when compared with the ordinary size of the window. Thus, a window 8" for an electrode contact is completed and a portion of the surface of the P type region 4 is exposed by the completed window 8'''. It is also possible to utilize a sputtering method or an ion etching method instead of a chemical etching method to etch the film 6.

Figure 11:
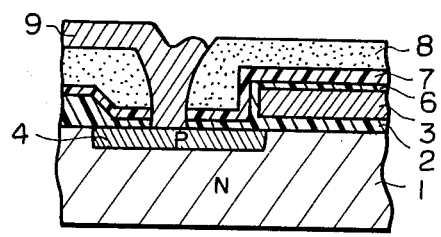

After the window 8" is completed, aluminum is deposited on the entire surface of the MIS device being produced and an aluminum electrode 9 for the source and drain is formed by a selective etching of the aluminum, as seen in FIG. 11. The electrode pattern of aluminum is formed by applying one of the ordinary methods, e.g. evaporation method and photolithographic method to the electrode pattern formation. The semiconductor substrate is heated under a hydrogen atmosphere to a temperature of from 400° to 500° C. after the deposition of the aluminum layer or the formation of the aluminum electrode 9.

When FIGS. 1 through 6 illustrating the process of the prior U.S. Pat. No. 4,224,089 are compared with FIGS. 7 through 11 illustrating an embodiment of the process according to the present invention, it will be apparent that the silicon nitride is removed in the former process, while the silicon nitride is not removed in the latter process. According to the present invention, the reoxidation after the selective removal of silicon nitride, which is carried out in the prior U.S. Pat. No. 4,224,089, is unnecessary. Accordingly, the process for producing the type of a semiconductor device is simplified and the reliability of such a process is enhanced by the process of the present invention. In addition, inadequate contact between the electrode and the substrate can be prevented by the process of the present invention.

Although the producing process according to the present invention has been described with reference to FIGS. 7 through 11, in which a metal insulator semiconductor device is illustrated, the process can also be applied to the production of a bipolar semiconductor device and an MOS capacitor, when an impurity of the first conductivity type diffused out of an impurity-containing glass film enters into a region of the second conductivity type and impedes ohmic contact between this region and a metal electrode.

Although the electrode 10 (FIG. 6) of the gate electrode is not provided in the above explained embodiment, such an electrode may be formed, if necessary.

The present invention will now be explained in further detail by way of the following Example.

EXAMPLE

A random access memory device having a capacity of 4 K bits was produced by the following procedure.

A 700 A thick gate oxide film 2 of an MIS semiconductor device was selectively formed on an N type silicon semiconductor substrate 1 (FIG. 7). A polycrystalline silicon was deposited on the gate oxide film 2 to a thickness of 4000 A, so as to form a gate electrode 3. Impurities were introduced into the substrate 1 in a concentration of $10^{20}/cm^3$, thereby forming the source and drain regions. One of these regions is shown in FIG. 7 denoted by reference numeral 4. A silicon dioxide film 6 was formed by a thermal oxidation method to a thickness of 300 A and a silicon nitride film 7 was grown by a vapor phase method to a thickness of 500 A. After deposition of a 10,000 A thick PSG film 8, and etching thereof to form a precursory window 8', the PSG film 8 was softened at a temperature of 1050° C., so as to round the edges of the precursory window 8'. The semiconductor substrate 1 was then heated to 900° C., in a hydrogen atmosphere, for 20 minutes. After completion of a window 8" and an aluminum electrode 9, the produced random access memory device was tested by measuring the source current between not shown terminals $V_{DD}$ (5 V) and $V_{ss}$ (0 V) over a period of 130 minutes. In FIG. 12, showing plots of the measurements, exhibited the source current ($I_{cc}$) indicated by the chain line according to the heat treatment of the present invention almost no secular change. The source current ($I_{cc}$) designates total currents through one chip of the random access memory device.

For comparison purposes, the secular change of the source current ($I_{cc}$) was measured with regard to a random access memory device which was produced by the procedure mentioned above, except for the heating at 900° C. in the hydrogen atmosphere. The solid line in FIG. 12 indicates that the change of the source current ($I_{cc}$) of this random access memory device was at a high rate.

What we claim is:

1. A process for producing a semiconductor device comprising,
   a semiconductor substrate, on which a source region and a drain region are formed with a gate region positioned between said source and drain regions,
   a gate insulating film formed on said gate region, and
   a gate electrode formed on said gate insulating film, said process comprising the steps of:
   forming said gate insulating film;
   forming said gate electrode on said gate insulating film;
   forming said source and drain regions in such a manner that said gate electrode is positioned between these regions;
   forming a masking film over said source and drain regions and gate electrode;
   forming a glass layer over said masking film;
   opening precursory electrode windows through predetermined portions of said glass layer;
   subjecting said glass layer to a heat treatment;
   opening an aperture at the precursory windows through said masking film, thereby completing electrode windows;
   depositing an electrode material on the so opened electrode windows, which electrode material extends from the electrode windows; and
   subjecting said semiconductor substrate to a heat treatment under a hydrogen atmosphere subsequent to said heat treatment step of the glass layer and prior to said depositing step of the electrode material.

2. A process according to claim 1, wherein said masking film comprises silicon nitride.

3. A process according to claim 1, wherein said masking film comprises a lower film of silicon dioxide and an upper film of silicon nitride.

4. A process according to claim 1, 2 or 3, wherein the heating temperature under the hydrogen atmosphere ranges from 800° to 1050° C.

5. A process according to claim 4, wherein said heating temperature ranges from 800° to 900° C.

6. A process according to claim 4, wherein said process further comprises the step of:
   subjecting said semiconductor substrate to a heat treatment at a temperature of from 400° to 500° C. under a hydrogen atmosphere subsequent to said depositing step of the electrode material.

7. A process for producing a semiconductor device comprising,
   a semiconductor substrate,
   an insulating film formed on one region of said semiconductor substrate, and
   an electrode formed on said insulating film, said process comprising the steps of:
   forming said insulating film;
   forming said electrode on said insulating film;
   forming a masking film over said electrode;
   forming a glass layer over said masking film;
   opening a precursory window through a predetermined portion of said glass layer;
   subjecting said glass layer to a heat treatment;
   opening an aperture at the precursory windows through said masking film, thereby completing electrode windows;
   depositing an electrode material on the so completed window, which electrode material extends from the window; and
   subjecting said semiconductor substrate to a heat treatment under a hydrogen atmosphere subsequent to said heat treatment step of the glass layer and prior to said depositing step of the electrode material.

8. A process according to claim 7, wherein said masking film is comprised of silicon nitride.

9. A process according to claim 7, wherein said masking film comprises a lower film of silicon dioxide and an upper film of silicon nitride.

10. A process according to claim 7, 8 or 9, wherein the heating temperature under the hydrogen atmosphere ranges from 800° to 1050° C.

11. A process according to claim 10, wherein said heating temperature ranges from 800° to 900° C.

12. A process according to claim 10, wherein said process further comprises the step of:
    subjecting said semiconductor substrate to a heat treatment at a temperature of from 400° to 500° C. under a hydrogen atmosphere subsequent to said depositing step of the electrode material.

* * * * *

UNITED STATES PATENT AND TRADEMARK OFFICE
CERTIFICATE OF CORRECTION

PATENT NO. : 4,271,582

DATED : June 9, 1981

INVENTOR(S) : KAZUNARI SHIRAI et al.

It is certified that error appears in the above—identified patent and that said Letters Patent is hereby corrected as shown below:

Front page, [73] Assignee, "Kanagawa" should be --Kawasaki--;

[56] References cited, "Levenstein" should be --Levinstein--.

Column 2, line 9, after "and" delete ",".

Column 3, line 27, "vapour" should be --vapor--;

line 61, after "4,224,089" insert --,--;

line 68, ", and;" should be --; and--.

In the following places, "A" should be --Å--:

Column 3, lines 19, 26, 29;

Column 4, lines 62, 65;

Column 5, lines 6, 8, 16, 65, 66;

Column 6, lines 54, 58, 64, 65, 66.

Signed and Sealed this

Fifth Day of February 1985

[SEAL]

Attest:

DONALD J. QUIGG

Attesting Officer — Acting Commissioner of Patents and Trademarks